US008531178B2

(12) United States Patent
Sasaki

(10) Patent No.: US 8,531,178 B2
(45) Date of Patent: Sep. 10, 2013

(54) ULTRASOUND PROBE, METHOD FOR MANUFACTURING THE SAME, AND ULTRASOUND DIAGNOSTIC APPARATUS

(75) Inventor: Takayuki Sasaki, Hino (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 715 days.

(21) Appl. No.: 12/733,778

(22) PCT Filed: Oct. 2, 2008

(86) PCT No.: PCT/JP2008/067931
§ 371 (c)(1), (2), (4) Date: Mar. 19, 2010

(87) PCT Pub. No.: WO2009/069379
PCT Pub. Date: Jun. 4, 2009

(65) Prior Publication Data

US 2010/0244812 A1 Sep. 30, 2010

(30) Foreign Application Priority Data

Nov. 26, 2007 (JP) ................................ 2007-304923

(51) Int. Cl.
*G01R 23/00* (2006.01)

(52) U.S. Cl.
USPC .................. 324/76.49; 324/754.25; 324/109; 29/25.35; 600/443; 600/459; 310/334; 310/313 R

(58) Field of Classification Search
USPC ................ 324/76.49, 754.25, 109; 29/25.35; 600/443, 459; 310/334, 313 R
See application file for complete search history.

(56) References Cited

U.S. PATENT DOCUMENTS

| | | | | |
|---|---|---|---|---|
| 4,704,774 | A | 11/1987 | Fujii et al. | |
| 5,902,241 | A | 5/1999 | Seyed-Bolorforosh et al. | |
| 5,998,907 | A * | 12/1999 | Taguchi et al. | 310/313 R |
| 6,174,286 | B1 | 1/2001 | Ramamurthy et al. | |
| 6,436,047 | B1 | 8/2002 | Ramamurthy et al. | |
| 2006/0142659 | A1* | 6/2006 | Okazaki et al. | 600/459 |
| 2006/0173321 | A1 | 8/2006 | Kubota et al. | |

FOREIGN PATENT DOCUMENTS

| | | | |
|---|---|---|---|
| JP | 59-178378 | A | 10/1984 |
| JP | 61-161446 | A | 7/1986 |
| JP | 3-151952 | A | 6/1991 |
| JP | 11-155863 | A | 6/1999 |
| JP | 11-221215 | A | 8/1999 |

(Continued)

OTHER PUBLICATIONS

Japanese Office Action dated Feb. 26, 2013, issued in counterpart Japanese Application No. 2009-543705, and English translation thereof.

*Primary Examiner* — Arleen M Vazquez
*Assistant Examiner* — Son Le
(74) *Attorney, Agent, or Firm* — Holtz, Holtz, Goodman & Chick, PC

(57) ABSTRACT

In an ultrasound probe (2) and a method for manufacturing the ultrasound probe (2) of the invention, an organic piezoelectric element (21) has a sheet-like form, and is directly or indirectly laminated on a part or the entirety of a plurality of inorganic piezoelectric elements (22). Accordingly, the ultrasound probe (2) can be manufactured with a less number of steps. An ultrasound diagnostic apparatus of the invention includes the ultrasound probe (2). Accordingly, the cost of the ultrasound diagnostic apparatus can be reduced.

9 Claims, 10 Drawing Sheets

(56) References Cited

FOREIGN PATENT DOCUMENTS

| | | | | |
|---|---|---|---|---|
| JP | 11-276478 | A | | 10/1999 |
| JP | 2002-530144 | A | | 9/2002 |
| JP | 2004-088056 | A | | 3/2004 |
| JP | 2004-208918 | A | | 7/2004 |
| JP | 2004208918 | A | * | 7/2004 |
| WO | WO 2004/066856 | A1 | | 8/2004 |

* cited by examiner

ULTRASOUND PROBE, METHOD FOR MANUFACTURING THE SAME, AND ULTRASOUND DIAGNOSTIC APPARATUS

This application is the United States national phase application of International Application PCT/JP2008/067931 filed Oct. 2, 2008.

TECHNICAL FIELD

The present invention relates to an ultrasound probe for transmitting/receiving an ultrasound wave, and a method for manufacturing the ultrasound probe. The present invention also relates to an ultrasound diagnostic apparatus provided with the ultrasound probe.

BACKGROUND ART

An ultrasound wave is normally a sound wave of 16,000 Hz or more, and is applied in various fields such as inspecting defects of an article, or diagnosing a disease, because the ultrasound wave can check the interior of an object non-destructively and non-invasively. One of the apparatuses utilizing an ultrasound wave is an ultrasound diagnostic apparatus, wherein a subject to be checked is scanned by an ultrasound wave, and an inner state of the subject is imaged based on a receiving signal generated from a reflection wave (an echo) of the ultrasound wave within the subject. The ultrasound diagnostic apparatus is provided with an ultrasound probe for transmitting/receiving an ultrasound wave with respect to a subject. The ultrasound probe generates an ultrasound wave by mechanical vibrations based on an electrical signal for transmission by utilizing a piezoelectric phenomenon. The ultrasound probe includes plural piezoelectric elements for generating an electrical signal for receiving by receiving a reflection wave of an ultrasound wave generated by mismatching of sound impedance within the subject, wherein the plural piezoelectric elements are arranged in e.g. two-dimensional arrays (see e.g. patent literature 1 (D1)).

In recent years, research and development have been made on the harmonic imaging technology of imaging an inner state of a subject, using a harmonic frequency component, in place of using a frequency (fundamental frequency) component of an ultrasound wave transmitted from an ultrasound probe to the interior of the subject. The harmonic imaging technology has various advantages: the contrast resolution is enhanced, because the side robe level is small as compared with the level of a fundamental frequency component, and the S/N ratio (signal to noise ratio) is increased; the resolution in a lateral direction is improved, because the beam width is reduced resulting from an increase in the frequency; multiple reflections are suppressed, because the sound pressure is small and a variation in sound pressure is small in a near-distance region; and a larger speed at a deep position can be secured, as compared with a case that a high frequency is used as a fundamental wave, because attenuation in a position farther from a focal point is substantially the same as that of the fundamental wave.

The ultrasound probe for use in the harmonic imaging technology requires a wide frequency band from a frequency of a fundamental wave to a frequency of a harmonic, a frequency range corresponding to a low frequency is utilized to transmit a fundamental wave, and a frequency range corresponding to a high frequency is utilized to receive a harmonic. An example of the ultrasound probe for use in the harmonic imaging technology is disclosed in patent literature 2 (D2).

FIG. 10 is a constructional diagram of a piezoelectric portion of the ultrasound probe disclosed in patent literature 2. FIG. 11 is an explanatory diagram of a method for manufacturing the piezoelectric portion of the ultrasound probe disclosed in patent literature 2.

Referring to FIG. 10, an ultrasound probe 500 disclosed in patent literature 2 includes a sound absorbing layer 501, a first piezoelectric layer 502 disposed on a front surface of the sound absorbing layer 501, a second piezoelectric layer 503 disposed on a front surface of the first piezoelectric layer 502, and a sound matching layer 504 disposed on a front surface of the second piezoelectric layer 503. The first piezoelectric layer 502 is constituted of first piezoelectric elements 5021 arranged in a certain direction. The first piezoelectric layer 502 has a thickness of one-half of a wavelength $\lambda 1$ to be calculated based on a sound velocity inherent to the first piezoelectric layer 502, corresponding to a fundamental frequency f1. The second piezoelectric layer 503 is constituted of second piezoelectric elements 5031 arranged with the same pitch as the pitch of the first piezoelectric elements 5021 of the first piezoelectric layer 502. The second piezoelectric layer 503 has a thickness of one-fourth of a wavelength $\lambda 2$ to be calculated based on a sound velocity inherent to the second piezoelectric layer 503, corresponding to a frequency f2, to receive an ultrasound wave of the frequency f2 of two times of the fundamental frequency f1. First electrodes 5051 used in common between the first piezoelectric elements 5021 and the second piezoelectric elements 5031 are formed between the first piezoelectric layer 502 and the second piezoelectric layer 503, with the same pitch as the pitch of the first piezoelectric elements 5021 and the second piezoelectric elements 5031 and by the same number as the number of the first piezoelectric elements 5021 and the second piezoelectric elements 5031. A second electrode 506 used in common between the first piezoelectric elements 5021 is formed between the first piezoelectric layer 502 and the sound absorbing layer 501. A third electrode 507 used in common between the second piezoelectric elements 5031 is formed between the second piezoelectric layer 503 and the sound matching layer 504. The ultrasound probe 500 disclosed in patent literature 2 is firmly contacted with a subject LB, whereby the ultrasound probe 500 is allowed to transmit/receive an ultrasound wave in a wide frequency band.

The ultrasound probe 500 disclosed in patent literature 2 is manufactured by the following steps. Referring to FIGS. 10 and 11, a first piezoelectric ceramic plate 5020 serving as the first piezoelectric layer 502 of a final product, and a second piezoelectric ceramic plate 5030 serving as the second piezoelectric layer 503 of the final product are placed one over the other, with a conductive mesh sheet coated with an electrode forming material, which serves as the first electrodes 5051 of the final product, being interposed therebetween, followed by baking. A second electrode 506 is formed in advance on the back surface of the first piezoelectric ceramic plate 5020. Subsequently, the two piezoelectric ceramic plates 5020 and 5030 placed one over the other are fixedly attached to the sound absorbing layer 501, and slits 5011 are formed. Thus, the first piezoelectric ceramic plate 5020 is formed into arrays of the first piezoelectric elements 5021, and the second piezoelectric ceramic plate 5030 is formed into arrays of the second piezoelectric elements 5031. The first electrodes 5051 arranged in a certain direction are also formed. Then, slits 5012 are formed in the second piezoelectric ceramic plate 5030 to such a depth that the first electrodes 5051 are not separated from each other. Then, a resin is impregnated into the slits 5011 and the slits 5012. After the resin is cured, the front surface of the second piezoelectric ceramic plate 5030 is abraded into a flat surface, and a third electrode 507 is formed by e.g. plating or vapor deposition. Then, the sound matching layer 504 is formed on the third electrode 507.

In the ultrasound probe having the above arrangement, as well as an ultrasound probe for use in harmonic imaging and laminated with first and second piezoelectric elements, it is necessary to provide a step of forming grooves (spacings, clearances, gaps, slits) in a piezoelectric plate in order to form plural piezoelectric elements out of the piezoelectric plate, divide the piezoelectric elements into groups depending on their functions, and individually operate the piezoelectric elements. Thus, a certain production cost for the ultrasound probe has been required.

Patent literature 1: JP 2004-088056A

Patent literature 2: JP Hei 11-276478A

SUMMARY OF INVENTION

In view of the above, an object of the invention is to provide an ultrasound probe producible with a less number of steps, a method for manufacturing the ultrasound probe, and an ultrasound diagnostic apparatus provided with the ultrasound probe.

In the inventive ultrasound probe and the inventive manufacturing method, an organic piezoelectric element has a sheet-like form, and is directly or indirectly laminated on a part or the entirety of a plurality of inorganic piezoelectric elements. Accordingly, the ultrasound probe can be manufactured with a less number of steps. The inventive ultrasound diagnostic apparatus includes the ultrasound probe. Accordingly, the cost of the ultrasound diagnostic apparatus can be reduced.

These and other objects, features and advantages of the present invention will become more apparent upon reading the following detailed description along with the accompanying drawings.

BEST MODE FOR CARRYING OUT THE INVENTION

Figure 1:
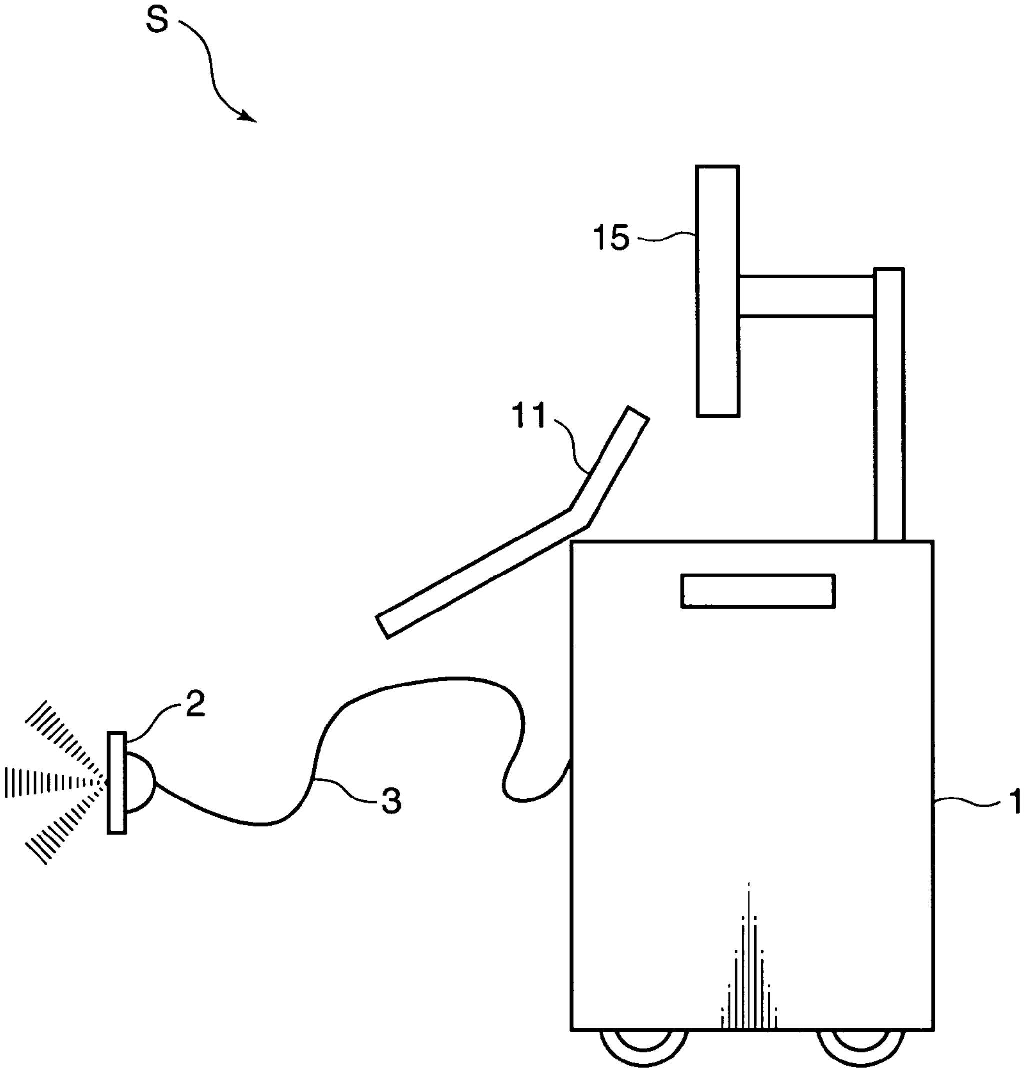
FIG. 1 is a diagram showing an external appearance of an ultrasound diagnostic apparatus embodying the invention.

In the following, an embodiment of the invention is described referring to the accompanying drawings. Elements with like reference numerals throughout the drawings have like arrangements, and repeated description thereof is omitted, as necessary.

(Arrangements and Operations of Ultrasound Diagnostic Apparatus and Ultrasound Probe)

Figure 2:
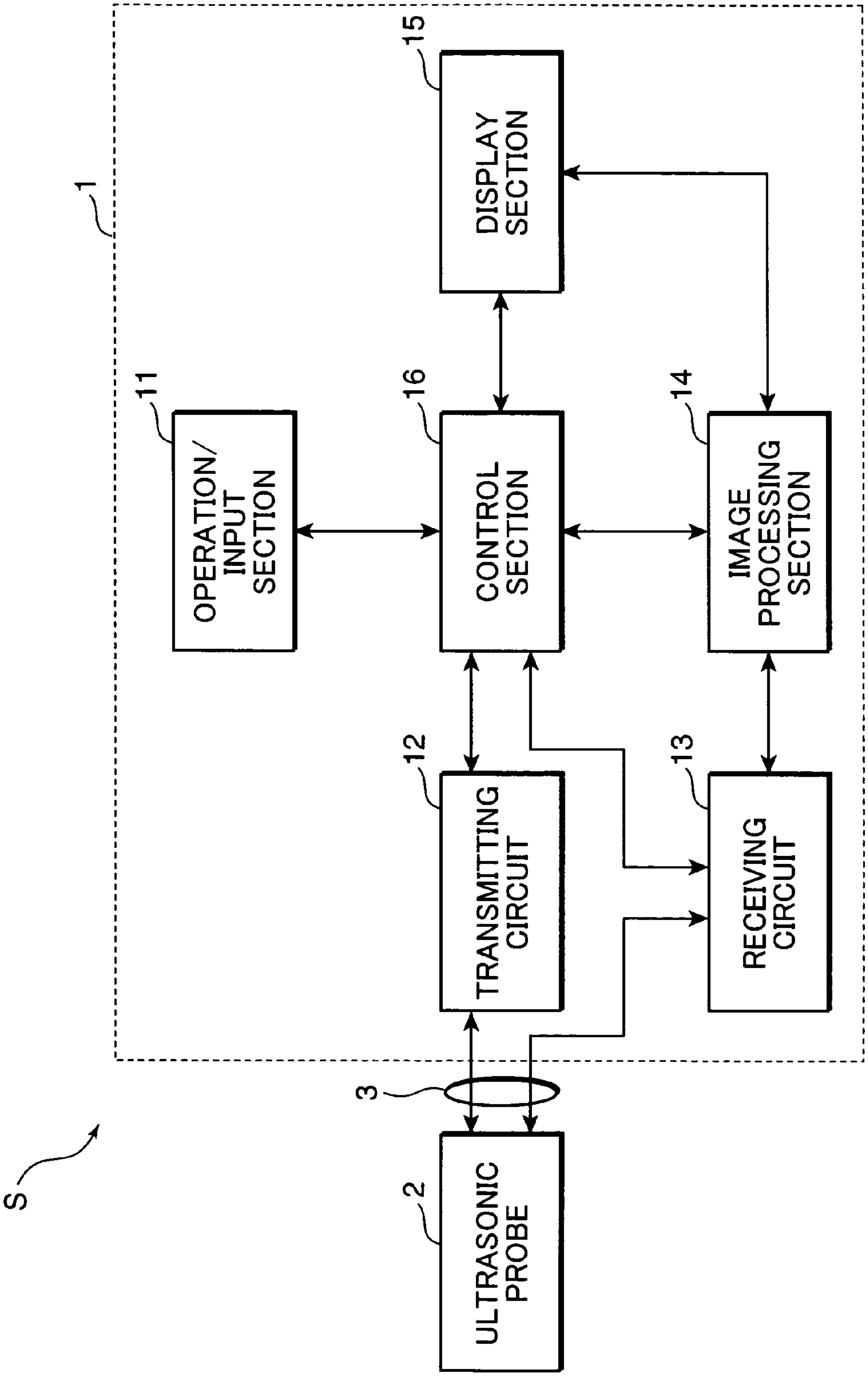
FIG. 2 is a block diagram showing an electrical configuration of the ultrasound diagnostic apparatus.
Figure 3:
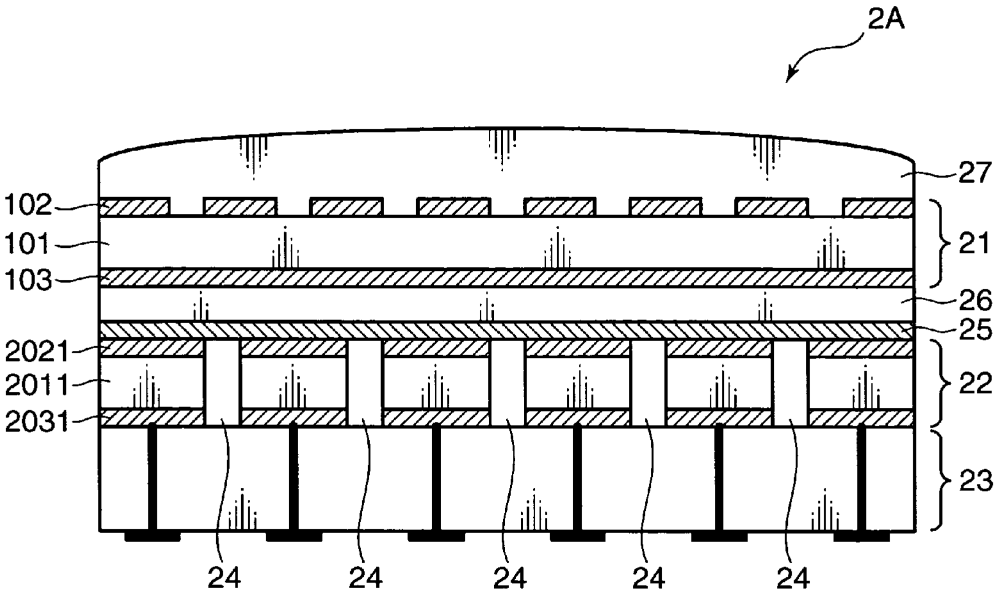
FIG. 3 is a cross-sectional view showing an arrangement of an ultrasound probe for use in the ultrasound diagnostic apparatus.

FIG. 1 is a diagram showing an external appearance of an ultrasound diagnostic apparatus embodying the invention. FIG. 2 is a block diagram showing an electrical configuration of the ultrasound diagnostic apparatus in the embodiment. FIG. 3 is a diagram showing an arrangement of an ultrasound probe for use in the ultrasound diagnostic apparatus in the embodiment.

As shown in FIGS. 1 and 2, an ultrasound diagnostic apparatus S includes an ultrasound probe 2 for transmitting an ultrasound wave (a first ultrasound signal) to an unillustrated subject such as a living body, and receiving a reflection wave (an echo or a second ultrasound signal) of the ultrasound wave reflected on the subject; and an ultrasound diagnostic apparatus 1 which is connected to the ultrasound probe 2 through a cable 3, transmits a transmitting signal as an electrical signal to the ultrasound probe 2 through the cable 3 to thereby control the ultrasound probe 2 to transmit the first ultrasound signal to the subject, and images an inner state of the subject as an ultrasound image, based on a receiving signal, as an electrical signal, which is generated in the ultrasound probe 2, in response to the second ultrasound signal which is received by the ultrasound probe 2 and derived from the subject.

As shown in FIG. 2, for instance, the ultrasound diagnostic apparatus 1 includes an operation/input section 11 for inputting a command of designating start of diagnosis, or data such as individual information on subjects; a transmitting circuit 12 for supplying a transmitting signal as an electrical signal to the ultrasound probe 2 through the cable 3 to cause the ultrasound probe 2 to generate an ultrasound wave; a receiving circuit 13 for receiving a receiving signal as an electrical signal from the ultrasound probe 2 through the cable 3; an image processing section 14 for generating an image (an ultrasound image) showing an inner state of a subject, based on the receiving signal received by the receiving circuit 13; a display section 15 for displaying the image showing the inner state of the subject, which has been generated by the image processing section 14; and a control section 16 for controlling the overall operations of the ultrasound diagnostic apparatus S by controlling the operation/input section 11, the transmitting circuit 12, the receiving circuit 13, the image processing section 14, and the display section 15 depending on the respective corresponding functions.

The ultrasound probe 2 includes plural inorganic piezoelectric elements made of an inorganic piezoelectric material, and operable to convert a signal between an electrical signal and an ultrasound signal by utilizing a piezoelectric phenomenon; and an organic piezoelectric element made of an organic piezoelectric material, and operable to convert a signal between an electrical signal and an ultrasound signal by utilizing a piezoelectric phenomenon. A feature of the ultrasound probe 2 resides in that the organic piezoelectric element is a sheet-like member which is directly or indirectly laminated on a part or the entirety of the inorganic piezoelectric elements.

An example of the ultrasound probe 2 having the above arrangement is an ultrasound probe 2A having an arrangement as shown FIG. 3. The ultrasound probe 2A includes a flat plate-shaped sound damper 23, plural inorganic piezoelectric elements 22 formed on one principal plane of the sound damper 23, a sound absorber 24 to be filled in the gaps between the inorganic piezoelectric elements 22, a common ground electrode layer 25 laminated on the inorganic piezoelectric elements 22, an intermediate layer 26 to be laminated on the common ground electrode layer 25, an organic piezoelectric element 21 to be laminated on the intermediate layer 26, and a sound matching layer 27 to be laminated on the organic piezoelectric element 21.

The sound damper 23 is made of a material capable of absorbing an ultrasound wave, and is adapted to absorb an ultrasound wave to be emitted from the inorganic piezoelectric elements 22 toward the sound absorber 23.

Each of the inorganic piezoelectric elements 22 is constituted of electrodes (electrode parts) 2021 and 2031 formed on opposing surfaces of a piezoelectric member (a piezoelectric part) 2011 made of an inorganic piezoelectric material. The inorganic piezoelectric elements 22 are arranged on the sound damper 23 in two-dimensional arrays in plan view, with a predetermined interval between the adjacent inorganic piezoelectric elements 22. The inorganic piezoelectric elements 22 may be so configured as to receive a reflection wave of an ultrasound wave. The ultrasound probe 2A and the ultrasound diagnostic apparatus S in this embodiment, however, are so configured as to transmit an ultrasound wave. Specifically, an electrical signal is inputted to the inorganic piezoelectric elements 22 from the transmitting circuit 12 through the cable 3. The electrical signal is inputted to the electrode part 2021 and the electrode part 2031 of each of the inorganic piezoelectric elements 22. Each of the inorganic piezoelectric elements 22 converts the electrical signal into an ultrasound signal to thereby transmit the ultrasound signal.

The sound absorber 24 is made of a material capable of absorbing an ultrasound wave, and is adapted to reduce mutual interference between the inorganic piezoelectric elements 22. The sound absorber 24 enables to reduce crosstalk between the inorganic piezoelectric elements 22.

The common ground electrode layer 25 is made of an electrical conductive material, and is grounded by an unillustrated wire. Laminating the common ground electrode layer 25 on the inorganic piezoelectric elements 22 enables to electrically connect the common ground electrode layer 25 to each of the electrode parts 2021 of the inorganic piezoelectric elements 22. Accordingly, each of the electrode parts 2021 of the inorganic piezoelectric elements 22 is grounded by the common ground electrode layer 25.

The intermediate layer 26 is a member for laminating the organic piezoelectric element 21 on the inorganic piezoelectric elements 22, and is adapted to match the sound impedance between the inorganic piezoelectric elements 22 and the organic piezoelectric element 21.

The organic piezoelectric element 21 is a sheet-like piezoelectric element constituted of a flat plate-shaped piezoelectric member 101 having a predetermined thickness and made of an organic piezoelectric material; electrodes (electrode parts) 102 individually formed on one principal plane of the piezoelectric member 101; and an electrode layer 103 uniformly formed substantially over the entire surface of the other principal plane of the piezoelectric member 101. By forming the electrode parts 102 on one principal plane of the piezoelectric member 101, the organic piezoelectric element 21 is constituted of plural piezoelectric elements each constituted of one of the electrode parts 102, a certain part of the piezoelectric member 101, and a certain part of the electrode layer 103; and the piezoelectric elements can be operated independently of each other. In this arrangement, there is no need of separating the piezoelectric elements constituting the organic piezoelectric element 21 one from the other to function the piezoelectric elements individually, unlike the inorganic piezoelectric elements, and the piezoelectric elements can be made from one sheet. Thus, in a production process of the organic piezoelectric element 21, there is no need of providing a step of forming grooves (spacings, clearances, gaps, slits) in a sheet-like plate member made of an organic piezoelectric material. This enables to simplify the production process of the organic piezoelectric element 21, thereby forming the organic piezoelectric element 21 with a less number of steps. Alternatively, the organic piezoelectric element 21 may be constituted of electrode parts 102, and electrode parts each constituting a pair with a corresponding one of the electrode parts 102, in place of forming the electrode layer 103, to provide plural piezoelectric elements constituting the organic piezoelectric element 21.

In the example shown in FIG. 3, the organic piezoelectric element 21 is indirectly laminated over the entirety of the inorganic piezoelectric elements 22 through the common ground electrode layer 25 and the intermediate layer 26. Alternatively, the organic piezoelectric element 21 may be laminated on a part of the inorganic piezoelectric elements 22.

The number of the electrode parts 102 of the organic piezoelectric element 21, and the number of the inorganic piezoelectric elements 22 may be identical to each other. In the embodiment, however, the number of the electrode parts 102 of the organic piezoelectric element 21, and the number of the inorganic piezoelectric elements 22 are different from each other. In other words, the number of piezoelectric elements constituting the organic piezoelectric element 21, and the number of the inorganic piezoelectric elements 22 are different from each other. Accordingly, even if the area of the inorganic piezoelectric elements 22, and the area of the organic piezoelectric element 21 constituted of the piezoelectric elements are identical to each other, it is possible to set the area of each one of the inorganic piezoelectric elements 22, and the area of each one of the piezoelectric elements constituting the organic piezoelectric element 21 independently of each other. Thus, the above arrangement enables to design the inorganic piezoelectric elements 22 depending on the specifications required for the inorganic piezoelectric elements 22, and design the organic piezoelectric element 21 depending on the specifications required for the organic piezoelectric element 21.

In the embodiment, the number of the electrodes 102 of the organic piezoelectric element 21 is set larger than the number of the inorganic piezoelectric elements 22. In other words, the number of the piezoelectric elements constituting the organic piezoelectric element 21 is set larger than the number of the inorganic piezoelectric elements 22. Accordingly, it is possible to increase the size (area) of each one of the inorganic piezoelectric elements 22, and in the case where the inorganic piezoelectric elements 22 are used for transmitting, the transmission power can be increased. Also, it is possible to increase the number of the piezoelectric elements constituting the organic piezoelectric element 21, and in the case where the organic piezoelectric element 21 is used for receiving, the receiving resolution can be enhanced.

The organic piezoelectric element 21 may be so configured as to transmit an ultrasound wave. The ultrasound probe 2A and the ultrasound wave diagnostic apparatus S in the embodiment, however, are so configured as to receive a reflection wave of an ultrasound wave. Specifically, the organic piezoelectric element 21 receives an ultrasound signal of a reflection wave, and converts the ultrasound signal into an electrical signal to thereby output the electrical signal. The electrical signal is outputted from the electrode parts 102 and the electrode layer 103 of the organic piezoelectric element 21. The electrical signal is outputted to the receiving circuit 13 through the cable 3.

The sound matching layer 27 is a member for matching a sound impedance of the inorganic piezoelectric elements 22 with a sound impedance of the subject, and matching a sound impedance of the organic piezoelectric element 21 with the sound impedance of the subject. The sound matching layer 27 includes a sound lens which is bulged into an arc shape, and is adapted to converge an ultrasound wave to be transmitted toward the subject.

In the ultrasound diagnostic apparatus S having the above arrangement, in response to input of designation to start diagnosis from the operation/input section 11, for instance, the transmitting circuit 12 generates a transmitting signal as an electrical signal under the control of the control section 16. The generated transmitting signal as an electrical signal is supplied to the ultrasound probe 2 through the cable 3. Specifically, the transmitting signal as an electrical signal is supplied to each of the inorganic piezoelectric elements 22 in the ultrasound probe 2. The transmitting signal as an electrical signal is e.g. a voltage pulse to be repeated at a predetermined cycle. Each of the inorganic piezoelectric elements 22 is expanded/contracted in the thickness direction thereof in response to supply of the transmitting signal as an electrical signal, and is subjected to ultrasound vibration in accordance with the transmitting signal as an electrical signal. By the ultrasound vibration, the inorganic piezoelectric elements 22 emit an ultrasound wave through the common ground electrode layer 25, the intermediate layer 26, the organic piezoelectric element 21, and the sound matching layer 27. When the ultrasound probe 2 is e.g. firmly contacted with the subject, an ultrasound wave is transmitted from the ultrasound probe 2 toward the subject.

The ultrasound probe 2 may be firmly contacted with a surface of the subject in use, or may be inserted into the interior of the subject e.g. a body cavity of a living body in use.

The ultrasound wave transmitted toward the subject is reflected on a boundary surface or boundary surfaces in the interior of the subject and having a different sound impedance, and becomes a reflection wave of the ultrasound wave. The reflection wave not only includes a frequency component (a fundamental frequency component of a fundamental wave) of the transmitted ultrasound wave, but also includes a frequency component of a harmonic having a frequency of an integral multiple of a fundamental frequency. For instance, the reflection wave includes a second-order harmonic component, a third-order harmonic component, and a fourth-order harmonic component of a frequency of two times, three times, and four times of the fundamental frequency. The reflection wave of the ultrasound wave is received by the ultrasound probe 2. Specifically, the reflection wave of the ultrasound wave is received by the organic piezoelectric element 21 through the sound matching layer 27, mechanical vibrations of the reflection wave are converted into an electrical signal by the organic piezoelectric element 21, and the electrical signal is extracted as a receiving signal. The extracted receiving signal as an electrical signal is received by the receiving circuit 13 through the cable 3 under the control of the control section 16.

In the foregoing operation, an ultrasound wave is successively transmitted toward the subject from each of the inorganic piezoelectric elements 22, and the ultrasound wave reflected on the subject is received by the organic piezoelectric element 21.

The image processing section 14 generates an image (an ultrasound image) showing an inner state of the subject, using e.g. a time from signal transmitting to signal receiving or the intensity of a receiving signal, based on the receiving signal received by the receiving circuit 13, under the control of the control section 16. The display section 15 displays the image showing the inner state of the subject, which has been generated in the image processing section 14, under the control of the control section 16. Since the ultrasound probe 2A and the ultrasound diagnostic apparatus S in this embodiment are designed to receive a harmonic of a fundamental wave, as described above, an ultrasound image can be imaged by the harmonic imaging technology. Accordingly, the ultrasound probe 2A and the ultrasound diagnostic apparatus S in this embodiment enable to provide a high-precision ultrasound image. Further, since a second-order harmonic and a third-order harmonic having a relatively large power are received, the embodiment is advantageous in providing a clear ultrasound image.

In the ultrasound probe 2A and the ultrasound diagnostic apparatus S in this embodiment, the inorganic piezoelectric elements 22 are so configured as to transmit an ultrasound wave. Since an ultrasound signal is transmitted by the inorganic piezoelectric elements 22 operable to increase a transmission power, the ultrasound probe 2A and the ultrasound diagnostic apparatus S enable to increase the transmission power with a relatively simplified structure. Accordingly, the ultrasound probe 2A and the ultrasound diagnostic apparatus S in this embodiment are suitable for the harmonic imaging technology requiring transmission of a fundamental wave with a relatively large power to obtain an echo of a harmonic. Thus, the embodiment is advantageous in providing a high-precision ultrasound image.

In the ultrasound probe 2A and the ultrasound diagnostic apparatus S in this embodiment, the organic piezoelectric element 21 is so configured as to receive a reflection wave of an ultrasound wave. Generally, a piezoelectric element made of an inorganic piezoelectric material is only operable to receive an ultrasound wave of a frequency of about two times of the frequency of a fundamental wave. On the contrary, a piezoelectric element made of an organic piezoelectric material is operable to receive an ultrasound of a frequency of e.g. about four to five times of the frequency of a fundamental wave, and is suitable for increasing the receiving frequency band. Since an ultrasound signal is received by the organic piezoelectric element 21 having a characteristic capable of receiving an ultrasound wave in a wide frequency band, the ultrasound probe 2A and the ultrasound diagnostic apparatus S in this embodiment are advantageous in using a wide frequency band with a relatively simplified structure. Accordingly, the ultrasound probe 2A and the ultrasound diagnostic apparatus S in this embodiment are suitable for the harmonic imaging technology requiring receiving a harmonic of a fundamental wave, and enable to provide a high-precision ultrasound image.

(Method for Manufacturing Ultrasound Probe)

The ultrasound probe 2 is manufactured by a step of producing the plural inorganic piezoelectric elements 22 made of an inorganic piezoelectric material, and operable to convert a signal between an electrical signal and an ultrasound signal by utilizing a piezoelectric phenomenon; a step of producing the sheet-like organic piezoelectric element 21 made of an organic piezoelectric material, and operable to convert a signal between an electrical signal and an ultrasound signal by utilizing a piezoelectric phenomenon; and a step of directly or indirectly laminating the organic piezoelectric element on a part or the entirety of the inorganic piezoelectric elements. Specifically, the ultrasound probe 2 is substantially manufactured by forming the inorganic piezoelectric elements 22 and the organic piezoelectric element 21 independently of each other, and laminating the organic piezoelectric element 21 on the inorganic piezoelectric elements 22.

More specifically, for instance, the ultrasound probe 2A having the arrangement as shown in FIG. 3 is manufactured as follows. FIGS. 4A through 7B are process diagrams (part 1 through part 4) showing a process of manufacturing the ultrasound probe for use in the ultrasound diagnostic apparatus of the embodiment. FIGS. 4A through 7B are cross-sectional views, except for FIGS. 4D and 5E. FIG. 4D is a perspective view of FIG. 4C, and FIG. 5E is a perspective view of FIG. 5D.

Figure 4A:
FIGS. 4A through 4D are process diagrams (part 1) showing a process of manufacturing the ultrasound probe for use in the ultrasound diagnostic apparatus.

As shown in FIG. 4A, at first, prepared is the flat plate-shaped piezoelectric member 101 having a predetermined thickness and made of an organic piezoelectric material. The thickness of the piezoelectric member 101 is optionally set depending on e.g. the frequency of an ultrasound wave to be received, or the kind of the organic piezoelectric material. For instance, in the case where an ultrasound wave having a central frequency of 8 MHz is received, the thickness of the piezoelectric member 101 is set to about 50 μm. An example of the organic piezoelectric material is a polymer of vinylidene fluoride. Another example of the organic piezoelectric material is vinylidene fluoride (VDF)-based copolymer. The VDF-based copolymer is a copolymer of vinylidene fluoride and other monomer. Examples of the other monomer are trifluoroethylene, tetrafluoroethylene, perfluoroalkylvinylether (PFA), perfluoroalcoxyethylene (PAE), and perfluorohexaethylene. The VDF-based copolymer has a property that the electromechanical coupling factor (a piezoelectric effect) in the thickness direction thereof is varied depending on a copolymerization ratio thereof. Accordingly, a proper copolymerization ratio is adopted depending on e.g. the specifications of the ultrasound probe. For instance, in the case where a vinylidene fluoride-trifluoroethylene copolymer is used, the copolymerization ratio of vinylidene fluoride is preferably in the range of from 60 mol % to 99 mol %. In the case where a composite element obtained by laminating an organic piezoelectric element on an inorganic piezoelectric element is used, the copolymerization ratio of vinylidene fluoride is preferably in the range of from 85 mol % to 99 mol %. In the case where the composite element is used, the other monomer may be perfluoroalkylvinylether (PFA), perfluoroalcoxyethylene (PAE), or perfluorohexaethylene. An example of the organic piezoelectric material is polyurea. In the case where polyurea is used, it is preferable to form a piezoelectric member by a vapor deposition polymerization method. An example of the monomer for forming polyurea is a monomer having a general structure: $H_2N—R—NH_2$, where R may include an alkylene group, a phenylene group, a bivalent heterocyclic group, or a heterocyclic group substitutable with any substituent. Polyurea may be a copolymer of a urea derivative and other monomer. A preferable example of polyurea is aromatic polyurea using 4,4'-diaminodiphenylmethane (MDA) and 4,4'-diphenylmethanediisocyanate (MDI).

Figure 4B:
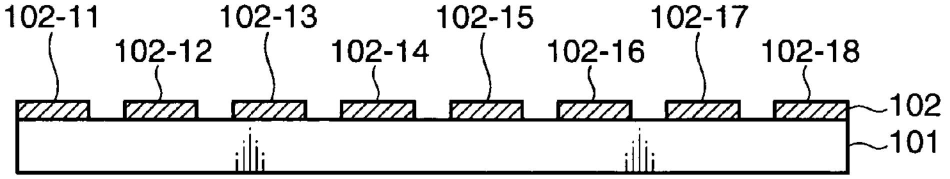
Figure 4C:
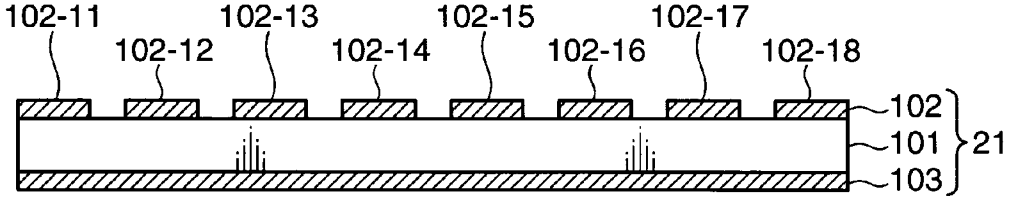
Figure 4D:
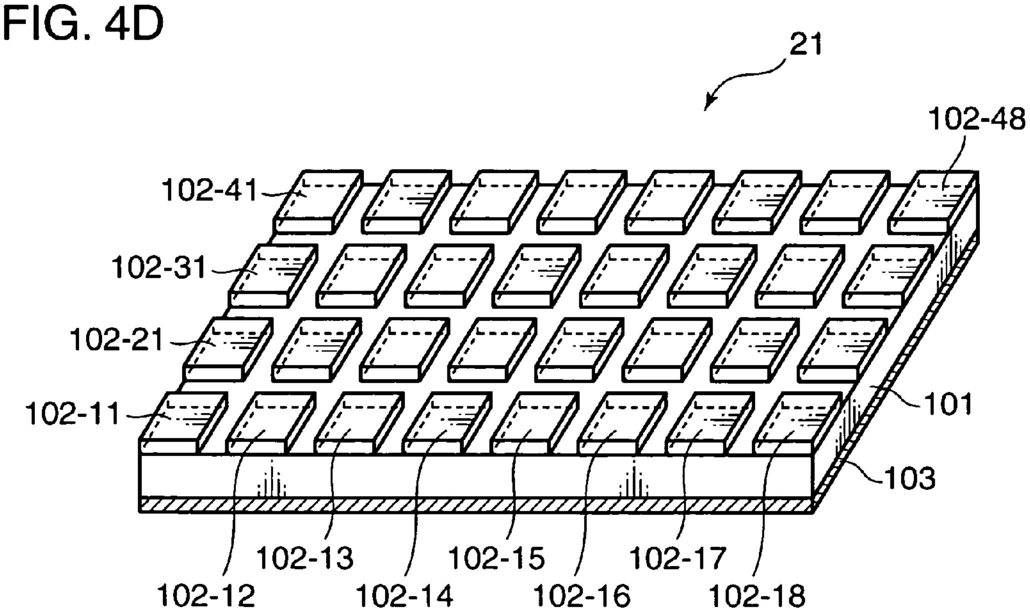

Next, as shown in FIG. 4B, the electrode parts 102 (102-11 through 102-48) are individually formed on one principal plane of the piezoelectric member 101 made of the organic piezoelectric material by e.g. screen printing, vapor deposition or sputtering. The electrode parts 102 are formed in linearly independent two directions in plan view e.g. two-dimensional arrays of m rows by n columns (where m, n is a positive integer) in two directions orthogonal to each other. Each of the electrode parts 102 has e.g. a rectangular shape in plan view, and the dimensions thereof are optionally set depending on e.g. the resolution, for instance, about 0.1 mm×0.1 mm.

In the specification, the elements are indicated with the reference numerals without suffixes, when the elements are referred to generically, and the elements are indicated with suffixes, when the elements are referred to individually.

As shown in FIGS. 4C and 4D, the electrode layer 103 is formed substantially on the entire surface on the other principal plane of the piezoelectric member 101 made of the organic piezoelectric material by e.g. screen printing, vapor deposition, or sputtering. Thereby, the electrode parts 102 are formed on one principal plane of the piezoelectric member 101 in two-dimensional arrays of m rows by n columns, and the organic piezoelectric element 21 having the electrode layer 103 is formed substantially over the entire surface on the other principal plane of the piezoelectric member 101. The organic piezoelectric member 21 having the above arrangement includes plural piezoelectric elements, each of which is constituted of one of the electrode parts 102, a certain part of the electrode layer 103 opposing to the electrode part 102, and a certain part of the piezoelectric member 101 made of the organic piezoelectric material and formed between the electrode part 102 and the part of the electrode layer 103.

According to the method for manufacturing the ultrasound probe 2A in the embodiment, plural piezoelectric elements are formed on the sheet-like piezoelectric member 101 made of an organic piezoelectric material by forming the individual electrode parts 102 on a surface of the sheet-like piezoelectric member 101. Accordingly, there is no need of providing a step of forming grooves (spacings, clearances, gaps, slits) in the sheet-like piezoelectric member 101 to form plural piezoelectric elements. Since the ultrasound probe 2A having the above arrangement does not require a step of forming grooves in the organic piezoelectric element 21, the production step of the organic piezoelectric element 21 is simplified, thereby enabling to manufacture the ultrasound probe 2A with a less number of steps.

In the foregoing, the electrode layer 103 is formed on the other principal plane of the piezoelectric member 101, after the electrode parts 102 are formed on one principal plane of the piezoelectric member 101. Alternatively, the electrode parts 102 may be formed on one principal plane of the piezoelectric member 101, after the electrode layer 103 is formed on the other principal plane of the piezoelectric member 101.

Figure 5A:
FIGS. 5A through 5E are process diagrams (part 2) showing the process of manufacturing the ultrasound probe for use in the ultrasound diagnostic apparatus.

Subsequently, as shown in FIG. 5A, a flat plate-shaped piezoelectric member 201 having a predetermined thickness and made of an inorganic piezoelectric material is prepared. Examples of the inorganic piezoelectric material are PZT, a crystal, lithium niobate ($LiNbO_3$), potassium tantalate niobate ($K(Ta,Nb)O_3$), barium titanate ($BaTiO_3$), lithium tantalate ($LiTaO_3$), and strontium titanate ($SrTiO_3$).

Figure 5B:
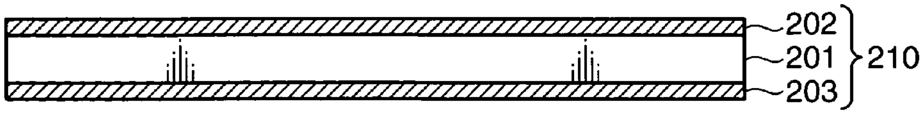

Next, as shown in FIG. 5B, electrode layers 202 and 203 are formed substantially on the entire surfaces of both principal planes of the piezoelectric member 201 made of the inorganic piezoelectric material, as opposed to each other, by e.g. screen printing, vapor deposition, or sputtering. Thereby, an inorganic piezoelectric member 210 constituted of the piezoelectric member 201 having the electrode layers 202 and 203 on both surface thereof is formed.

Figure 5C:
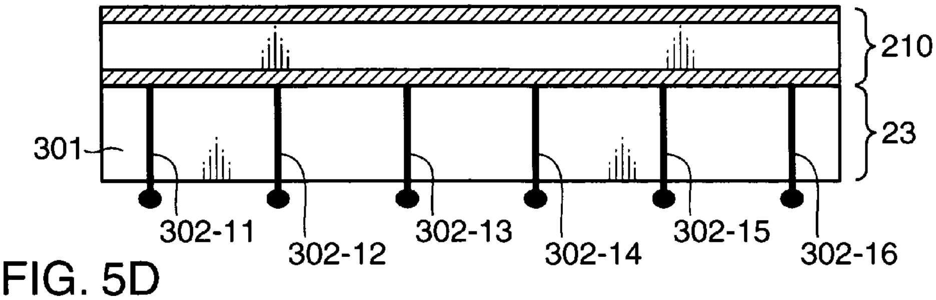

Next, as shown in FIG. 5C, the inorganic piezoelectric member 201 is laminated on the flat plate-shaped sound damper 23. The sound damper 23 includes a flat plate-shaped sound absorber 301 for absorbing an ultrasound wave, and is adapted to absorb an ultrasound wave to be emitted from a surface of the inorganic piezoelectric member 201 in proximity to the sound damper 23. Signal lines 302 (302-11 through 302-46) for transmitting an electrical signal for transmission pass through the ultrasound absorber 301 in the laminated direction. In the case where the inorganic piezoelectric member 201 is laminated on the sound damper 23, each of the signal lines 302 is electrically connected to the electrode layer (e.g. the electrode layer 203 in this embodiment) formed on one principal plane of the piezoelectric member 201.

Figure 5D:
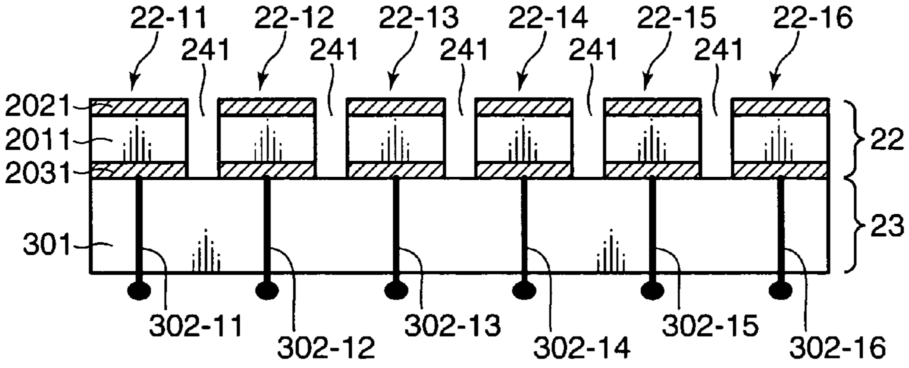
Figure 5E:
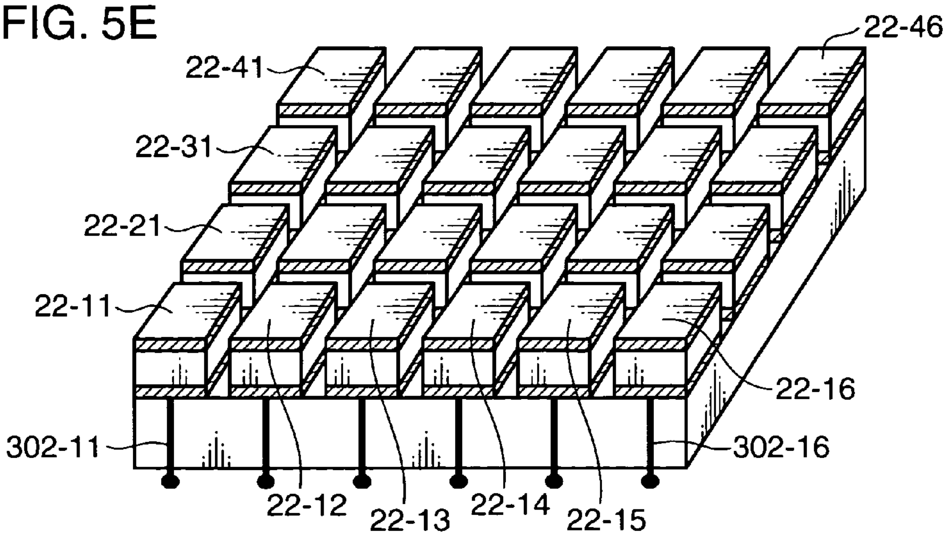

Next, as shown in FIGS. 5D and 5E, grooves (spacings, clearances, gaps, slits) 241 are formed in the inorganic piezoelectric member 210 in the laminated direction to such a depth that the sound damper 23 is exposed by e.g. a dicing saw. The grooves 241 are formed in linearly independent two directions in plan view, for instance, in such a manner that the inorganic piezoelectric elements 22 (22-11 through 22-46) are formed in two-dimensional arrays of p rows by q columns (where p, q is a positive integer) in two directions orthogonal to each other. By forming the grooves 241, one of the electrode layers i.e. the electrode layer 202 is formed into the electrode parts 2021, the piezoelectric member 201 made of an inorganic material is formed into the piezoelectric parts 2011, and the other of the electrode layers i.e. the electrode layer 203 is formed into the electrode parts 2031. Each of the electrode parts 2021 (the piezoelectric parts 2011 and the electrode parts 2031) has e.g. a rectangular shape in plan view, and the dimensions thereof are optionally set depending on e.g. the resolution, for instance, about 0.4 mm×0.4 mm. By forming the grooves 241 in linearly independent two directions, the inorganic piezoelectric member 210 is formed into the inorganic piezoelectric elements 22, each of which is constituted of one of the electrode parts 2021, one of the electrode parts 2031 opposing to the electrode part 2021, and one of the piezoelectric parts 2011 made of an inorganic piezoelectric material and formed between the electrode parts 2021 and 2031.

Figure 6A:
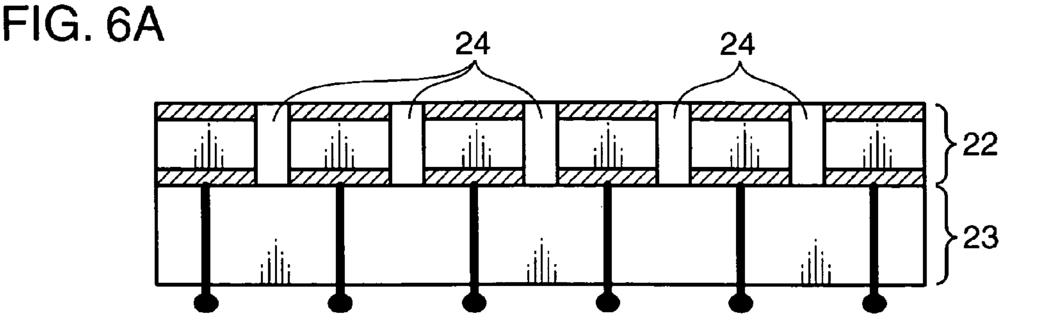
FIGS. 6A through 6D are process diagrams (part 3) showing the process of manufacturing the ultrasound probe for use in the ultrasound diagnostic apparatus.

Subsequently, as shown in FIG. 6A, the sound absorber 24 e.g. a resin for absorbing an ultrasound wave is filled in the grooves 241 for forming the inorganic piezoelectric member 210 into the piezoelectric elements 22 to reduce mutual interference between the inorganic piezoelectric elements 22. Examples of the resin are thermoset resins such as a polyimide resin and an epoxy resin. Filing the sound absorber 24 in the grooves 241 enables to reduce crosstalk between the inorganic piezoelectric elements 22.

Figure 6B:
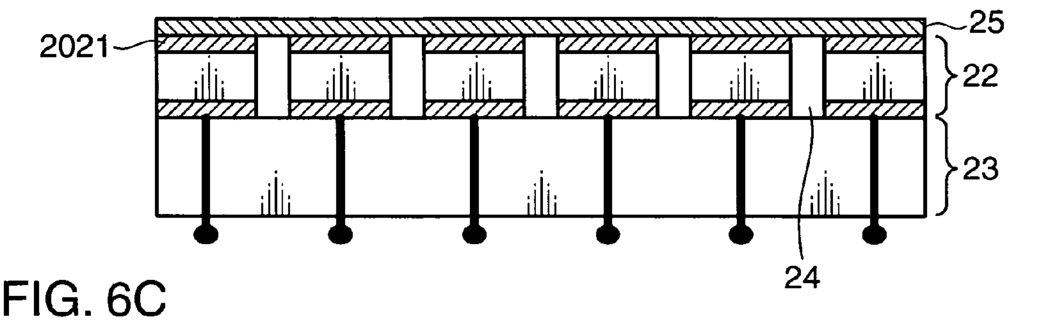

Next, as shown in FIG. 6B, the common ground electrode layer 25 as a common ground electrode is formed into a layer substantially over the entirety of the front surfaces of the inorganic piezoelectric elements 22, opposing to the surfaces of the inorganic piezoelectric elements 22 in proximity to the sound damper 23, by e.g. screen printing, vapor deposition, or sputtering. Each of the electrodes 2021 of the inorganic piezoelectric elements 22, which are formed on the front surfaces of the inorganic piezoelectric elements 22, is electrically connected to the common ground electrode layer 25.

Figure 6C:
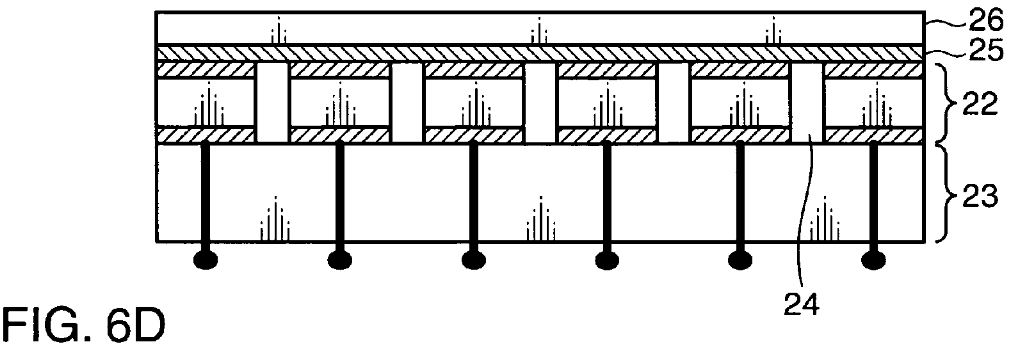

Next, as shown in FIG. 6C, the intermediate layer (a buffer layer) 26 is laminated into a layer substantially over the entire surface of the common ground electrode layer 25.

Figure 6D:
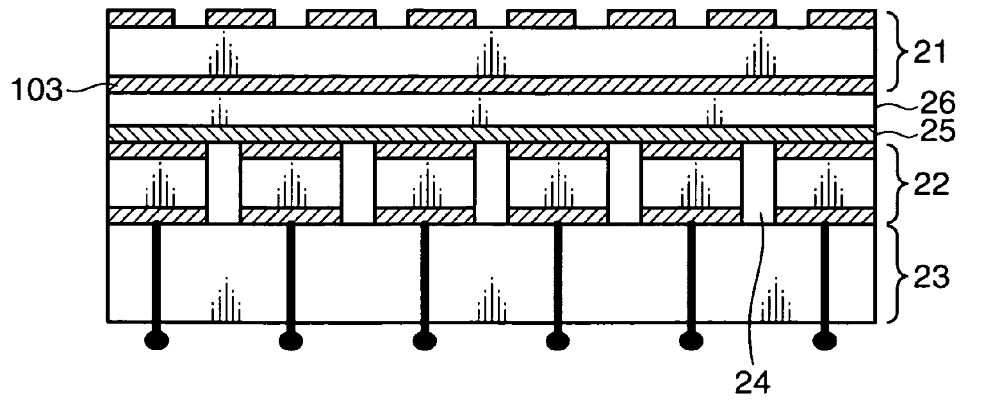

Next, as shown in FIG. 6D, the sheet-like organic piezoelectric element 21 produced by the aforementioned process is laminated on the intermediate layer 26. The organic piezoelectric element 21 is fixedly formed on the inorganic piezoelectric elements 22 by e.g. an adhesive agent. In the ultrasound probe 2A having the arrangement as shown in FIG. 3, the organic piezoelectric element 21 is laminated on the intermediate layer 26 in such a manner that the electrode layer 103 formed substantially over the entire surface of the organic piezoelectric element 21 is proximate to the intermediate layer 26.

Figure 7A:
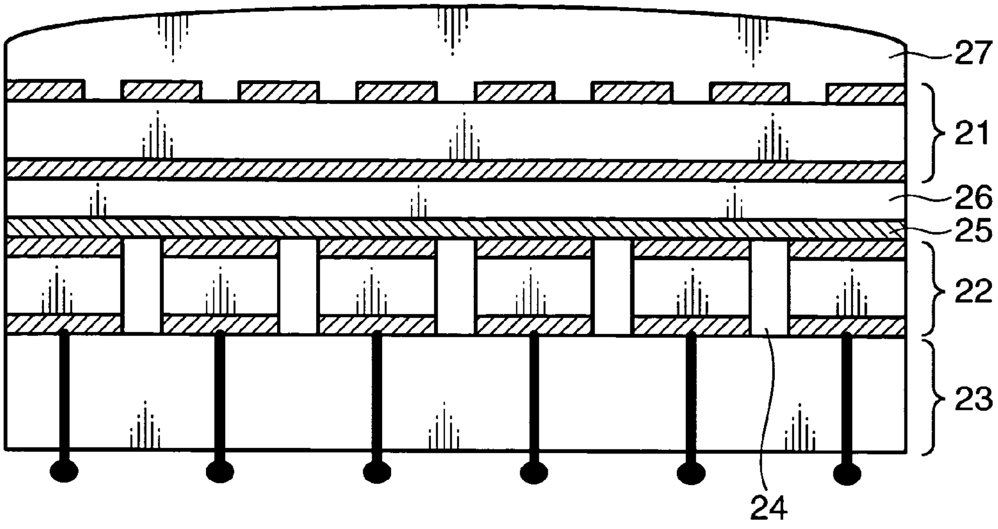
FIGS. 7A and 7B are process diagrams (part 4) showing the process of manufacturing the ultrasound probe for use in the ultrasound diagnostic apparatus.

Subsequently, as shown in FIG. 7A, the sound matching layer 27 is formed on the organic piezoelectric element 21. In the ultrasound probe 2A having the arrangement as shown in FIG. 3, the sound matching layer 27 is formed on electrode parts 1021 formed on the organic piezoelectric element 21 in two-dimensional arrays. The sound matching layer 27 is constituted of a single layer or plural layers, as necessary. For instance, in the case where the receiving frequency band is increased, the sound matching layer 27 is preferably constituted of plural layers.

Figure 7B:
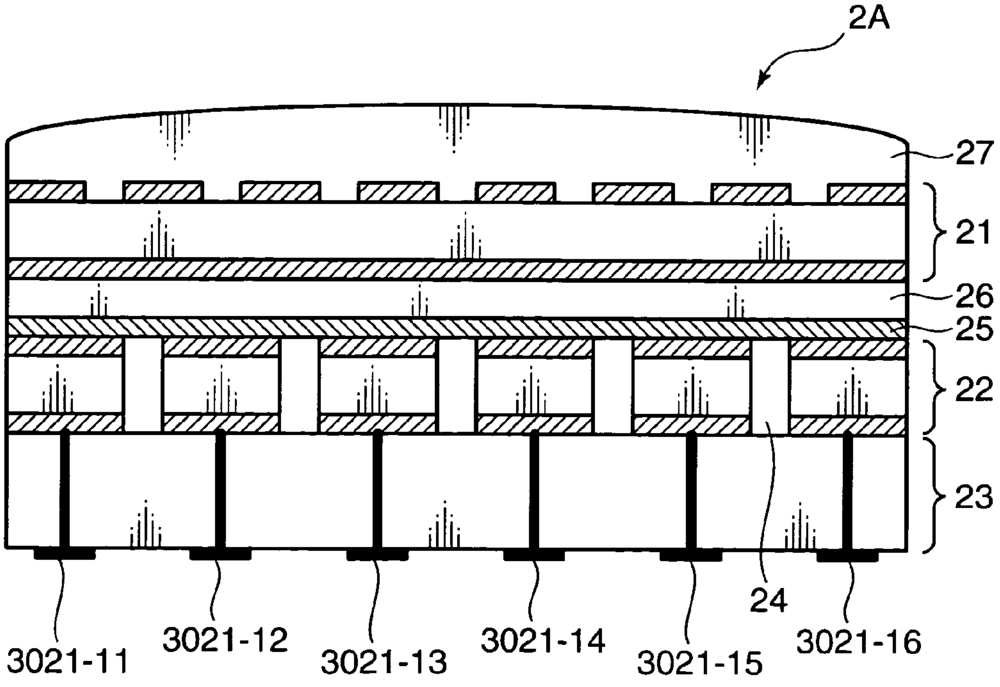

Then, as shown in FIG. 7B, electric conductive pads 2021 are formed on the back surface of the sound damper 23, opposing to the surface of the sound damper 23 in proximity to the inorganic piezoelectric elements 22. Each of electric conducive pads 3021 is electrically connected to the corresponding signal line 302 passing through the ultrasound absorber 301. Thus, the ultrasound probe 2A having the arrangement as shown in FIG. 3 is manufactured.

The method for manufacturing the ultrasound probe 2 in this embodiment is advantageous in simplifying the production step of the organic piezoelectric element 21 as described above, thereby enabling to manufacture the ultrasound probe 2 with a less number of steps. Accordingly, the ultrasound diagnostic apparatus S in this embodiment is advantageous in providing an apparatus equipped with the ultrasound probe 2 manufactured with a less number of steps, and reducing the cost of the apparatus.

Figure 8:
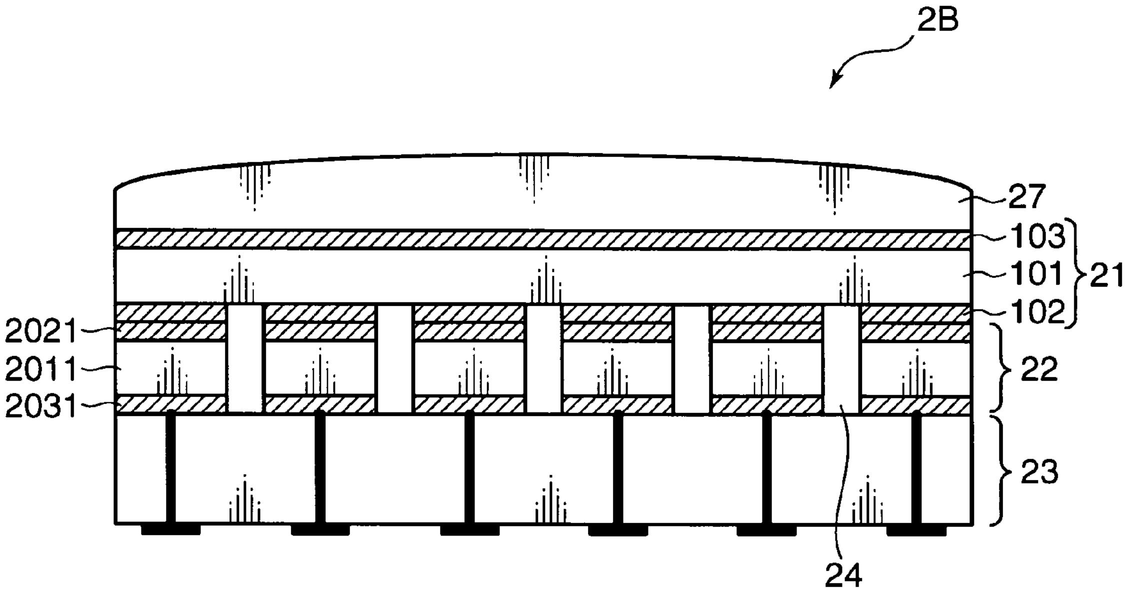
FIG. 8 is a cross-sectional view showing another arrangement of the ultrasound probe for use in the ultrasound diagnostic apparatus.
Figure 9A:
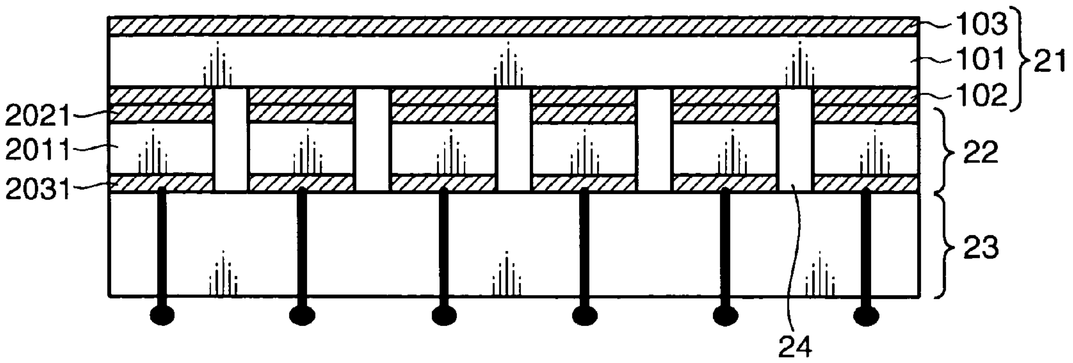
FIGS. 9A through 9C are process diagrams showing a process of manufacturing the ultrasound probe having the another arrangement for use in the ultrasound diagnostic apparatus.
Figure 9B:
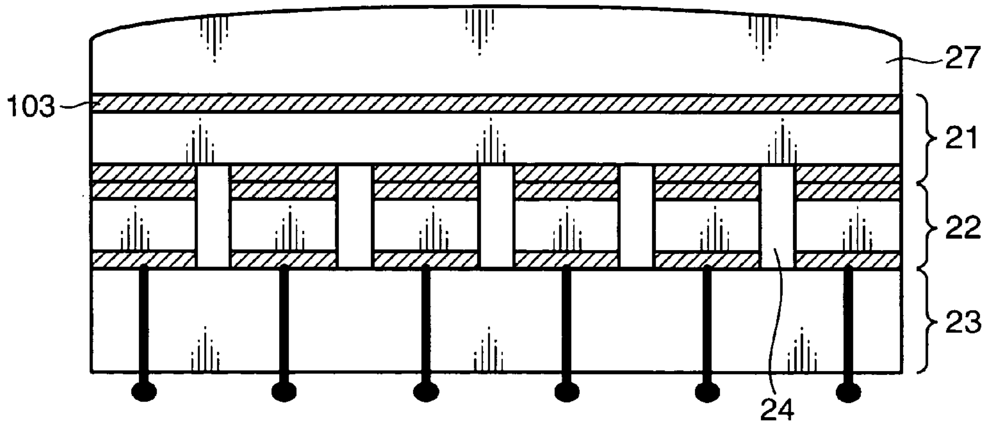
Figure 9C:
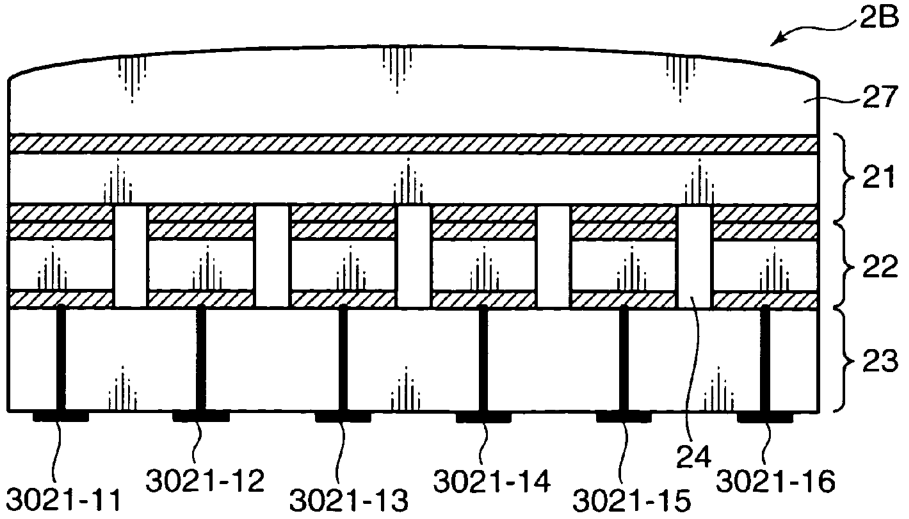
Figure 10:
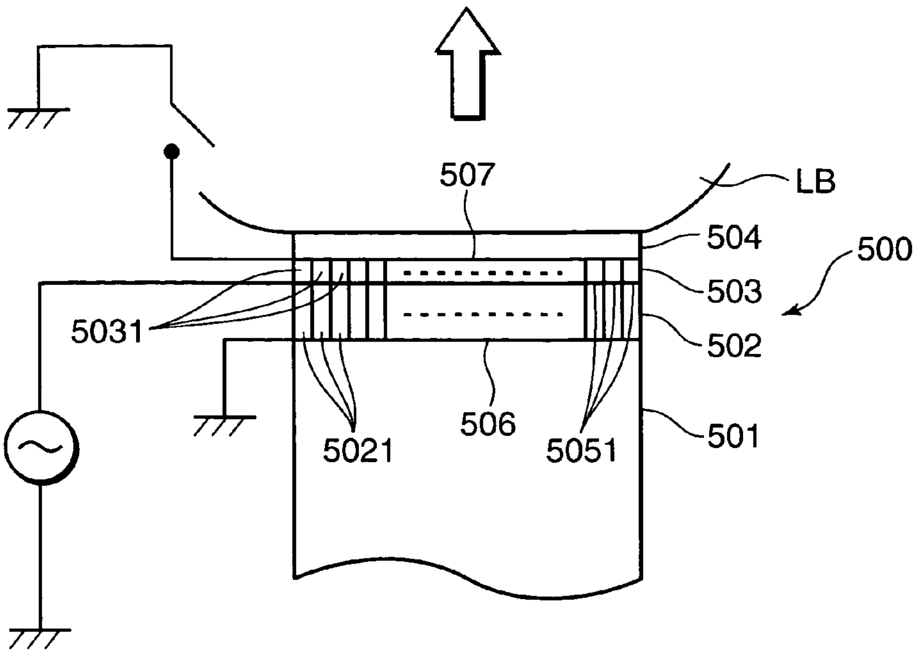
FIG. 10 is a constructional diagram showing a piezoelectric portion of the ultrasound probe disclosed in patent literature 2.
Figure 11:
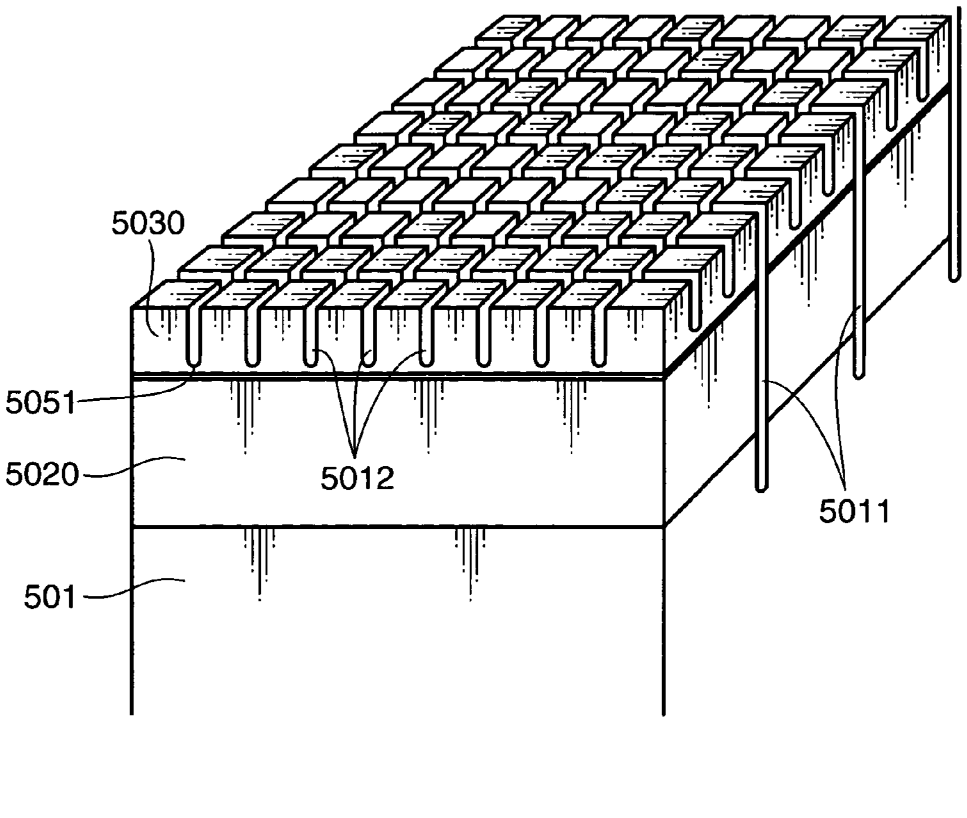
FIG. 11 is an explanatory diagram showing a method for manufacturing the piezoelectric portion of the ultrasound probe disclosed in patent literature 2.

FIG. 8 is a cross-sectional view showing another arrangement of the ultrasound probe for use in the ultrasound diagnostic apparatus in this embodiment. FIGS. 9A through 9C are process diagrams showing a process of manufacturing the ultrasound probe having the another arrangement for use in the ultrasound diagnostic apparatus in this embodiment.

In the embodiment, the ultrasound probe 2 is the ultrasound probe 2A, wherein the organic piezoelectric element 21 is laminated on the inorganic piezoelectric elements 22 through the intermediate layer 26 and the common ground electrode layer 25, with the electrode layer 103 formed substantially over the entire surface of the piezoelectric member 101 opposing to the inorganic piezoelectric elements 22. Alternatively, as shown in FIG. 8, an ultrasound probe 2B may be constructed in such a manner that the organic piezoelectric element 21 is directly laminated on the inorganic piezoelectric elements 22, with the electrode parts 102 opposing to the inorganic piezoelectric elements 22. Since the ultrasound probe 2B having the above arrangement does not require forming the common ground electrode layer 25 and the intermediate layer 26, the ultrasound probe 2B is more advantageous in reducing the number of steps, as compared with the ultrasound probe 2A having the arrangement as shown in FIG. 3, and the production cost of the ultrasound probe 2B can be reduced.

The ultrasound probe 2B having the arrangement as shown in FIG. 8 is manufactured as follows. First, the organic piezoelectric element 21 is produced according to a production step substantially the same as the production step described referring to FIGS. 4A through 4D. Further, the inorganic piezoelectric elements 22 laminated on the sound damper 23 are produced according to the production step substantially the same as the production step described referring to FIGS. 5A through 5E. Then, the sound absorber 24 e.g. a resin for absorbing an ultrasound wave is filled in the grooves 241 for forming the inorganic piezoelectric member 210 into piezoelectric elements according to the production step substantially the same as the production step described referring to FIG. 6A.

Subsequently, as shown in FIG. 9A, the sheet-like organic piezoelectric element 21 produced by the aforementioned production step is laminated on the surfaces (the front surfaces) of the inorganic piezoelectric elements 22, opposing to the surfaces of the inorganic piezoelectric elements 22 in proximity to the sound damper 23. The organic piezoelectric element 21 is fixedly formed on the inorganic piezoelectric elements 22 by e.g. an adhesive agent. In the ultrasound probe 2B having the arrangement as shown in FIG. 8, the organic piezoelectric element 21 is laminated on the inorganic piezoelectric elements 22 in such a manner that each of the electrode parts 102 of the organic piezoelectric element 21 is proximate to the corresponding electrode part 2021 of each of piezoelectric elements 221 of the inorganic piezoelectric element 22. Accordingly, the arrangement pattern of the electrode parts 102 of the organic piezoelectric element 21, and the arrangement pattern of the piezoelectric elements 221 of the inorganic piezoelectric element 22 are made substantially identical to each other. In the ultrasound probe 2B having the arrangement as shown in FIG. 8, m=p, and n=q.

Next, as shown in FIG. 9B, the sound matching layer 27 is formed on the organic piezoelectric element 21. In the ultrasound probe 2B having the arrangement as shown in FIG. 8, the sound matching layer 27 is formed on the electrode layer 103 formed substantially over the entire surface of the organic piezoelectric element 21.

Next, as shown in FIG. 9C, the electric conductive pads 3021 are formed on the back surface of the sound damper 23. Each of the electric conductive pads 3021 is electrically connected to the corresponding signal line 302 passing through the ultrasound absorber 301. Thus, the ultrasound probe 2B having the arrangement as shown in FIG. 8 is manufactured.

In the embodiment, each of the inorganic piezoelectric elements 22 is formed of a single layer of the piezoelectric part 2011 having the electrode parts 2021 and 2031 on both surfaces thereof. Alternatively, each of the inorganic piezoelectric elements 22 may be formed of plural layers of the piezoelectric parts 2011, wherein each of the piezoelectric parts 2011 has the electrode parts 2021 and 2031 on both surfaces thereof. In the embodiment, the organic piezoelectric element 21 is constituted of a single layer of the piezoelectric member 101, wherein the electrode parts 1021 and the electrode layer 103 are formed on both surfaces of the piezoelectric member 101. Alternatively, the organic piezoelectric element 21 may be constituted of plural layers of the piezoelectric members 101, each of which is constituted of the electrode parts 1021 and the electrode layer 103 on both surfaces thereof. It is needless to say that the inorganic piezoelectric elements 22 may be constituted of a single layer, and the organic piezoelectric element 21 may be constituted of plural layers. Further alternatively, the inorganic piezoelectric elements 22 may be constituted of plural layers, and the organic piezoelectric element 21 may be constituted of a single layer. Forming a piezoelectric element of plural layers enables to increase the transmission power, in the case where an ultrasound wave is transmitted, and enhance the receiving sensitivity, in the case where an ultrasound wave is received.

The specification discloses the aforementioned various aspects of the technology, and the following is a summary of the technology.

An ultrasound probe according to an aspect ultrasound probe includes a plurality of inorganic piezoelectric elements made of an inorganic piezoelectric material, and operable to convert a signal between an electrical signal and an ultrasound signal by utilizing a piezoelectric phenomenon; and an organic piezoelectric element made of an organic piezoelectric material, and operable to convert a signal between an electrical signal and an ultrasound signal by utilizing a piezoelectric phenomenon, wherein the organic piezoelectric element is a sheet-like member which is directly or indirectly laminated on a part or an entirety of the inorganic piezoelectric elements.

In the ultrasound probe having the above arrangement, a piezoelectric device for transmitting/receiving an ultrasound wave is constituted of a two-layer laminate having an organic piezoelectric element and plural inorganic piezoelectric elements. The organic piezoelectric element is a sheet-like member which is directly or indirectly laminated on a part or the entirety of the inorganic piezoelectric elements. An organic piezoelectric material is capable of forming plural piezoelectric elements by forming individual electrodes on a surface of a sheet-like plate member made of the organic piezoelectric material, and there is no need of providing a step of forming grooves (spacings, clearances, gaps, slits) in a sheet-like plate member to form plural piezoelectric elements. Since the ultrasound probe having the above arrangement does not require a step of forming grooves in an organic piezoelectric element, the production step of the organic piezoelectric element is simplified, thereby enabling to manufacture the ultrasound probe with a less number of steps.

Preferably, in the ultrasound probe, the organic piezoelectric element may include a plurality of electrodes on at least one surface thereof.

In the above arrangement, since the organic piezoelectric element includes a plurality of electrodes on at least one surface thereof, the organic piezoelectric element has plural piezoelectric elements. Accordingly, the ultrasound probe having the above arrangement enables to scan a subject using an ultrasound wave.

Preferably, in the ultrasound probe, the number of the inorganic piezoelectric elements, and the number of the electrodes of the organic piezoelectric element may be different from each other.

In the above arrangement, it is possible to make the number of the inorganic piezoelectric elements different from the number of the piezoelectric elements constituting the organic piezoelectric element. Accordingly, it is possible to set the area of each one of the inorganic piezoelectric elements and the area of each one of the piezoelectric elements constituting the organic piezoelectric element independently of each other, even if the area of the inorganic piezoelectric elements and the area of the organic piezoelectric element constituted of the piezoelectric elements are identical to each other. Thus, the above arrangement enables to design the inorganic piezoelectric elements depending on the specifications required for the inorganic piezoelectric elements, and design the organic piezoelectric element depending on the specifications required for the organic piezoelectric element.

Preferably, in the ultrasound probe, the number of the electrodes of the organic piezoelectric element may be set larger than the number of the inorganic piezoelectric elements.

In the above arrangement, the number of the inorganic piezoelectric elements is set smaller than the number of the piezoelectric elements constituting the organic piezoelectric element. Accordingly, it is possible to increase the size (area) of each one of the inorganic piezoelectric elements, and in the case where the inorganic piezoelectric elements are used for transmission, the transmission power can be increased. Also, it is possible to increase the number of the piezoelectric elements constituting the organic piezoelectric element, and in the case where the organic piezoelectric element is used for receiving, the receiving resolution can be enhanced. Thus, the ultrasound probe having the above arrangement enables to provide a high-precision ultrasound image.

Preferably, in the ultrasound probe having one of the above arrangements, each of the inorganic piezoelectric elements may convert the electrical signal into the ultrasound signal in response to input of the electrical signal to transmit the ultrasound signal.

In the above arrangement, since an ultrasound signal is transmitted by the inorganic piezoelectric elements operable to increase the transmission power, the transmission power can be increased with a relatively simplified structure. Accordingly, the ultrasound probe having the above arrangement is suitable for the harmonic imaging technology requiring to transmit an ultrasound wave of a fundamental wave with a relatively large power in order to obtain an echo of a harmonic, and enables to provide a high-precision ultrasound image.

Preferably, in the ultrasound probe having one of the above arrangements, the organic piezoelectric element may convert the ultrasound signal into the electrical signal in response to receiving the ultrasound signal to output the electrical signal.

In the above arrangement, since an ultrasound signal is received by the organic piezoelectric element having a characteristic capable of receiving an ultrasound wave in a relatively wide frequency range, the frequency band can be increased with a relatively simplified structure. Accordingly, the ultrasound probe having the above arrangement is suitable for the harmonic imaging technology requiring to receive an ultrasound wave of a harmonic, and enables to provide a high-precision ultrasound image.

Preferably, in the ultrasound probe having one of the above arrangements, each of the inorganic piezoelectric elements may convert a first electrical signal into a first ultrasound signal in response to input of the first electrical signal to transmit the first ultrasound signal, and the organic piezoelectric element may convert a second ultrasound signal into a second electrical signal in response to receiving the second ultrasound signal as a harmonic of the first ultrasound signal to output the second electrical signal.

In the above arrangement, since a harmonic of a fundamental wave is received, it is possible to image an ultrasound image by the harmonic imaging technology. Accordingly, the ultrasound probe having the above arrangement enables to provide a high-precision ultrasound image.

Preferably, in the ultrasound probe, the second ultrasound signal may be a second harmonic and a third harmonic of the first ultrasound signal.

In the above arrangement, since a second harmonic and a third harmonic having a relatively large power are received, the ultrasound probe having the above arrangement enables to provide a clear ultrasound image.

A method for manufacturing an ultrasound probe according to another aspect includes a step of producing a plurality of inorganic piezoelectric elements made of an inorganic piezoelectric material, and operable to convert a signal between an electrical signal and an ultrasound signal by utilizing a piezoelectric phenomenon; a step of producing a sheet-like organic piezoelectric element made of an organic piezoelectric material, and operable to convert a signal between an electrical signal and an ultrasound signal by utilizing a piezoelectric phenomenon; and a step of directly or indirectly laminating the organic piezoelectric element on a part or an entirety of the inorganic piezoelectric elements.

In the above arrangement, the inorganic piezoelectric elements and the organic piezoelectric element are produced by the individual production steps, and the sheet-like organic piezoelectric element is laminated on the inorganic piezoelectric elements, whereby an ultrasound probe is manufactured. As described above, the organic piezoelectric material is capable of forming plural piezoelectric elements by forming individual electrodes on a surface of a sheet-like plate member made of the organic piezoelectric material, and there is no need of providing a step of forming grooves (spacings, clearances, gaps, slits) in a sheet-like plate member to form plural piezoelectric elements. Since the method for manufacturing the ultrasound probe having the above arrangement does not require a step of forming grooves in a production step of an organic piezoelectric element, the production step of the organic piezoelectric element is simplified, thereby enabling to manufacture the ultrasound probe with a less number of steps.

An ultrasound diagnostic apparatus according to another aspect of the invention includes the ultrasound probe having any one of the above arrangements.

The above arrangement enables to provide an ultrasound diagnostic apparatus equipped with the ultrasound probe manufactured with a less number of steps. Accordingly, it is possible to reduce the cost of the ultrasound diagnostic apparatus.

This application is based on Japanese Patent Application No. 2007-304923 filed on Nov. 26, 2007, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

INDUSTRIAL APPLICABILITY

According to the invention, provided are an ultrasound probe for transmitting/receiving an ultrasound wave, a method for manufacturing the ultrasound probe, and an ultrasound diagnostic apparatus with the ultrasound probe.

The invention claimed is:

1. An ultrasound probe comprising:

a plurality of inorganic piezoelectric elements for transmitting an ultrasound wave, wherein the plurality of inorganic piezoelectric elements are arranged with a first predetermined pitch in arrays, and wherein each of the plurality of inorganic piezoelectric elements is made of an inorganic piezoelectric material and has two opposing surfaces each provided with an electrode; and an organic piezoelectric element for receiving an ultrasound wave, wherein the organic element is made of a sheet-like organic piezoelectric material and is directly or indirectly laminated on and extends over the plurality of inorganic piezoelectric elements, wherein the organic piezoelectric element has two opposing surfaces each provided with an electrode, and wherein at least one of the electrodes of the organic piezoelectric element includes a plurality of electrodes which are separated from one another and arranged with a second predetermined pitch in arrays, wherein the first predetermined pitch with which the plurality of inorganic piezoelectric elements are arranged and the second predetermined pitch with which the plurality of electrodes provided on a surface of the organic piezoelectric element are arranged are different from each other.

2. The ultrasound probe according to claim 1, wherein the first predetermined pitch with which the plurality of inorganic piezoelectric elements are arranged is larger than the second predetermined pitch with which the plurality of electrodes provided on the surface of the organic piezoelectric element are arranged.

3. The ultrasound probe according to claim 1, wherein each of the inorganic piezoelectric elements converts a first electrical signal into a first ultrasound signal in response to input of the first electrical signal to transmit the first ultrasound signal, and the organic piezoelectric element converts a second ultrasound signal into a second electrical signal in response to receiving the second ultrasound signal as a harmonic of the first ultrasound signal to output the second electrical signal.

4. The ultrasound probe according to claim 3, wherein the second ultrasound signal is a second harmonic and a third harmonic of the first ultrasound signal.

5. An ultrasound diagnostic apparatus comprising the ultrasound probe of claim 1.

6. The ultrasound probe according to claim 2, wherein each of the inorganic piezoelectric elements converts a first electrical signal into a first ultrasound signal in response to input of the first electrical signal to transmit the first ultrasound signal, and the organic piezoelectric element converts a second ultrasound signal into a second electrical signal in response to receiving the second ultrasound signal as a harmonic of the first ultrasound signal to output the second electrical signal.

7. The ultrasound probe according to claim 6, wherein the second ultrasound signal is a second harmonic and a third harmonic of the first ultrasound signal.

8. The ultrasound probe according to claim 1, wherein the plurality of inorganic piezoelectric elements and the plurality of electrodes provided on the surface of the organic piezoelectric element are each arranged in two-dimensional arrays.

9. An ultrasound probe comprising:

a plurality of inorganic piezoelectric elements for transmitting an ultrasound wave, wherein the plurality of inorganic piezoelectric elements are arranged with a first predetermined pitch in arrays, and wherein each of the plurality of inorganic piezoelectric elements is made of an inorganic piezoelectric material and has two opposing surfaces each provided with an electrode; and an organic piezoelectric element for receiving an ultrasound wave, wherein the organic element is made of a sheet-like organic piezoelectric material and is directly or indirectly laminated on and extends over the plurality of inorganic piezoelectric elements, wherein the organic piezoelectric element has two opposing surfaces each provided with an electrode, and wherein at least one of the electrodes of the organic piezoelectric element includes a plurality of electrodes which are separated from one another and arranged with a second predetermined pitch in arrays, wherein one of the two opposing surfaces of the organic piezoelectric element is provided with the plurality of electrodes which are separated from each other and arranged with the second predetermined pitch in arrays, and the other of the two opposing surfaces of the organic piezoelectric element is provided with an electrode formed over substantially an entirety thereof.

* * * * *